(12) United States Patent
Goth et al.

(10) Patent No.: US 7,378,603 B2
(45) Date of Patent: May 27, 2008

(54) ENHANCED BLIND-MATED INPUT/OUTPUT CARD CASSETTE PACKAGING CONCEPT

(75) Inventors: Gary F. Goth, Pleasant Valley, NY (US); John J. Loparco, Poughkeepsie, NY (US); Andrew Rybak, Hopewell Junction, NY (US); John G. Torok, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 11/262,050

(22) Filed: Oct. 28, 2005

(65) Prior Publication Data
US 2007/0095569 A1 May 3, 2007

(51) Int. Cl.
*H05K 9/00* (2006.01)

(52) U.S. Cl. .............. 174/370; 361/754; 361/809; 361/752; 174/382

(58) Field of Classification Search ........... 174/542, 174/50, 520, 559, 561, 563, 564, 554, 535, 174/370, 382; 220/241, 242, 3.2, 3.3, 3.6, 220/3.8; 194/207, 206; 165/63, 64; 361/754, 361/809, 752, 816, 818
See application file for complete search history.

(56) References Cited

U.S. PATENT DOCUMENTS

| | | | | |
|---|---|---|---|---|
| 4,333,521 A | * | 6/1982 | Stottman et al. | 165/63 |
| 5,624,017 A | * | 4/1997 | Plesko | 194/207 |
| 5,793,607 A | * | 8/1998 | Karidis et al. | 361/684 |
| 6,021,049 A | * | 2/2000 | Thompson et al. | 361/759 |
| 6,147,872 A | * | 11/2000 | Roy | 361/754 |
| 6,147,878 A | * | 11/2000 | Heselton | 361/798 |
| 6,148,506 A | * | 11/2000 | Vermette | 29/758 |
| 6,160,717 A | * | 12/2000 | Desousa et al. | 361/798 |
| 6,802,117 B2 | * | 10/2004 | Dalisay | 29/758 |

* cited by examiner

*Primary Examiner*—Hung V. Ngo
(74) *Attorney, Agent, or Firm*—Lily Neff

(57) ABSTRACT

An improved method and a cassette assembly for protecting electronic components, comprising of a housing that encloses the electronic components disposed over an insulator. The housing also encases a scissor jack component that can move from a first to a second position to enable actuation and unmating of the cassette assembly, such as to a next level of packaging. The housing has an overhang design, having complementary upper openings and lower cable shroud areas for supporting cable connections and for providing heat dissipation relief and EMC containment. Alternate designs provide for other components such as a honey comb screen and an EMC gasket to further enable EMC containment. In addition, other components such as an actuation trap door, a retention feature and card support members or support struts can be added to the design to enable better actuation and provide for an improved structural rigidity.

20 Claims, 6 Drawing Sheets

ENHANCED BLIND-MATED INPUT/OUTPUT CARD CASSETTE PACKAGING CONCEPT

CROSS-REFERENCE TO RELATED APPLICATIONS

This application contains subject matter which is related to the subject matter of the following co-pending applications, filed on the same day, which is assigned to the same assignee as this application, International Business Machines Corporation of Armonk, N.Y. Each of the below listed applications is hereby incorporated herein by reference in its entirety: POU920050073US1 and POU920050074US1.

TRADEMARKS

IBM ® is a registered trademark of International Business Machines Corporation, Armonk, N.Y., U.S.A. S/390, Z900 and z990 and other names used herein may be registered trademarks, trademarks or product names of International Business Machines Corporation or other companies.

BACKGROUND OF THE INVENTION

1. Field of the Invention

This invention relates to packaging of electronic components of a computing system and more particularly to packaging of input/output tailstock areas of large processor cards.

2. Description of Background

The industry trend has been to continuously increase the number of electronic components inside computing systems. A computing system can include a simple personal computer, a network of simple computers, or one or even a network of large computers in processing communication with one another that include one or more servers having central electronic systems (CEC). While increasing the components inside a simple computing system does create some challenges, however, such an increase create many problems in computing systems that include one or more large computers. The evolution of high end computing systems especially, including servers, have imposed particular packaging challenges with respect to a variety of problems that are seemingly isolated issues but affect one another a single assembly environment. Thermal management, mechanical integrity and electromagnetic and electrical shorts have been some of the challenging issues that have created special design concerns for the developers of such systems.

Each of these issues are further exasperated in the future by the development of next generation processors that require increased packaging density, causing more concerns especially in the area of heat dissipation. Heat dissipation if unresolved, can result in electronic and mechanical failures that will affect overall system performance. As can be easily understood, the heat dissipation increases as the packaging density increases. In larger computing systems, such as servers that include next generation processors, the problem of heat dissipation becomes of particular concern.

An increased package density has also placed increased demands on the manner the computing systems are packaged. One key problem area in large computers is how to best utilize the tailstock areas of large processing cards where traditionally input/output (I/O) areas are also located. As mentioned, thermal management in dense packages have put increasing demands on mechanical designers to utilize unique approaches to maximize cooling. Combined with the concerns in the manner that the processing cards need to be populated, thermal management has often led the designers to provide air-cooling capabilities within a predefined footprint.

A recent popular prior art approach has been to place the I/O tailstock areas in what is known as the "windward" side of the processor cards, where they are in direct contact with an air input stream. Unfortunately, in this approach, the I/O tailstock areas are governed by the amount of available air for cooling the electronic packages contained within a particular packaging assembly and depending on packaging flexibility, this approach may lead to inefficient heat dissipation.

In addition, the problem of heat dissipation is further exasperated by the recent prior art orientation of cards. Historically, the orientation of the processing cards has migrated form the more traditional in-line plugging approach to a more recent version that utilizes a blind-mate style to allow for other processing and packaging needs. The key difference between these two approaches is the fact that in the former approach, the in-line plugging connects by mating the interconnect to a card that typically lies perpendicular to the air-stream. The latter approach, however, does so in a parallel fashion which minimizes the air flow impedance.

Another development that causes additional concerns is the advancements in cable operation speed. The rise of processor and cable operation speeds, especially in the ranges exceeding 5 GHz, not only creates additional thermal management concerns but also creates issues relating to electromagnetic interference containment and mechanical support in a structural sense.

The mechanical concerns are derived from both obvious and non-obvious sources. For example, a contributing factor that may not be as obvious as the traditional mechanical support concerns stems from the fact that the increased system operating speeds have driven the necessity of implementing surface mount technology (SMT) style connectors, whose predominant mechanical support must be derived from the card's mechanical structure. This is mostly necessary in order to isolate potential damaging strains at the soldered interface.

Currently, there is no single design that can efficiently address all problems as enumerated above. Attempts to improve packaging designs to resolve of one set of the previously enumerated problems, often cause other such problems to worsen. Consequently and in light of the prior art current designs that affect overall system performance, a packaging concept is desirous that can address all such issues including but not limited to thermal management and cooling concerns, electromagnetic interface concerns and mechanical and structural support concerns in such computing system packaging but especially for those that include the next generation of blind-mated I/O card cassettes as part of their packaging and assembly.

SUMMARY OF THE INVENTION

The present invention provides for a cassette assembly and associate method of fabricating such assembly. The cassette assembly is provided protecting electronic components and comprises a housing for enclosing electronic components provided in at least one processing card disposed over an insulator; and a scissor jack can move from a first to a second position to enable actuation and unmating of the cassette assembly, such as to a next level of packaging. The housing has an overhang design, having complementary upper openings and lower cable shroud areas. In one embodiment, the housing is comprised of two complementary halves such that when they are disposed over one another, they form a single unitary housing unit. In this embodiment, the upper housing includes the opening area, preferably in the form of an inlet screen with apertures designed to relieve heat dissipation and provide electromagnetic (EMC) containment. The lower housing includes an integral cable shroud with openings to enable support of cable connections. In alternate embodiments, other components such as a honey comb screen and an EMC gasket can be added to the housing design to further enable EMC containments.

In an alternate embodiment, other components such as an actuation trap door, a retention feature and card support members or support struts can be added to the design to enable better actuation and provide for an improved structural rigidity.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DESCRIPTION OF THE INVENTION

The difficulties discussed with the prior art currently being practiced are resolved by the workings of the present invention, which represents a significant improvement in electronic packaging over prior art by addressing key areas of deficiencies as previously enumerated. Since deficiencies in the prior art currently being practiced will become even more challenging in next generation devices both from an electromagnetic and a cooling perspective, the present invention provides features that will not only address the prior art concerns, but also that will provide many capabilities for next generation devise.

In one embodiment as will be presently discussed in conjunction with FIGS. 1 through 6, the present invention provide for a cassette assembly concept with improved thermal abilities. This concept also provides unique features that facilitate high-frequency attenuation of electromagnetic (EMC) emissions. In addition, the cassette assembly concept will provide a smooth and tactile actuation mechanism that is easily securable to the next and higher level of packaging. Another improvement offered by the present invention is to provide additional structural support and improve interconnect reliability of cables. This and other advantages will now be discussed in conjunction with the figures provided.

Figure 2A:
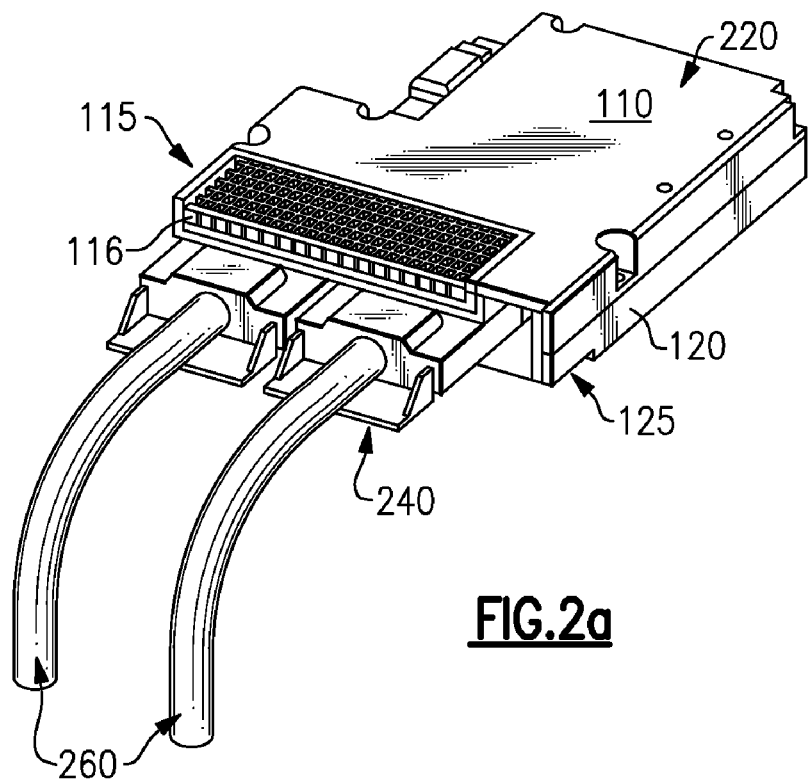
FIGS. 2a and 2b respectively provide front and rear enclosed views of the cassette as provided by the embodiment of FIG. 1.
Figure 2B:
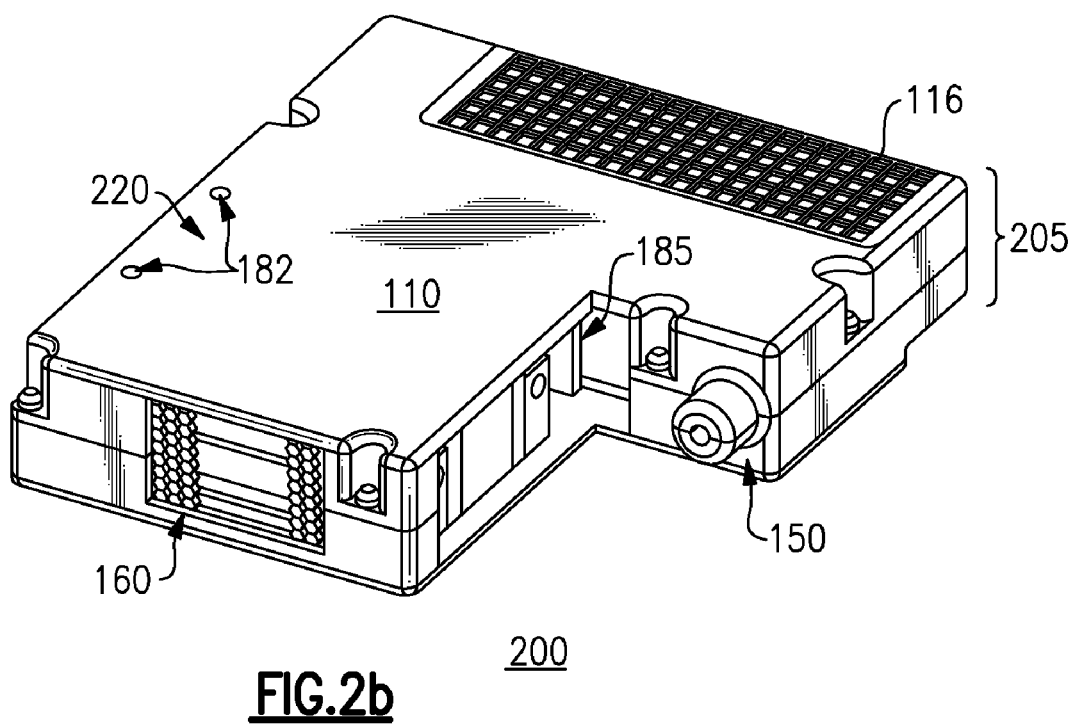
Figure 6:
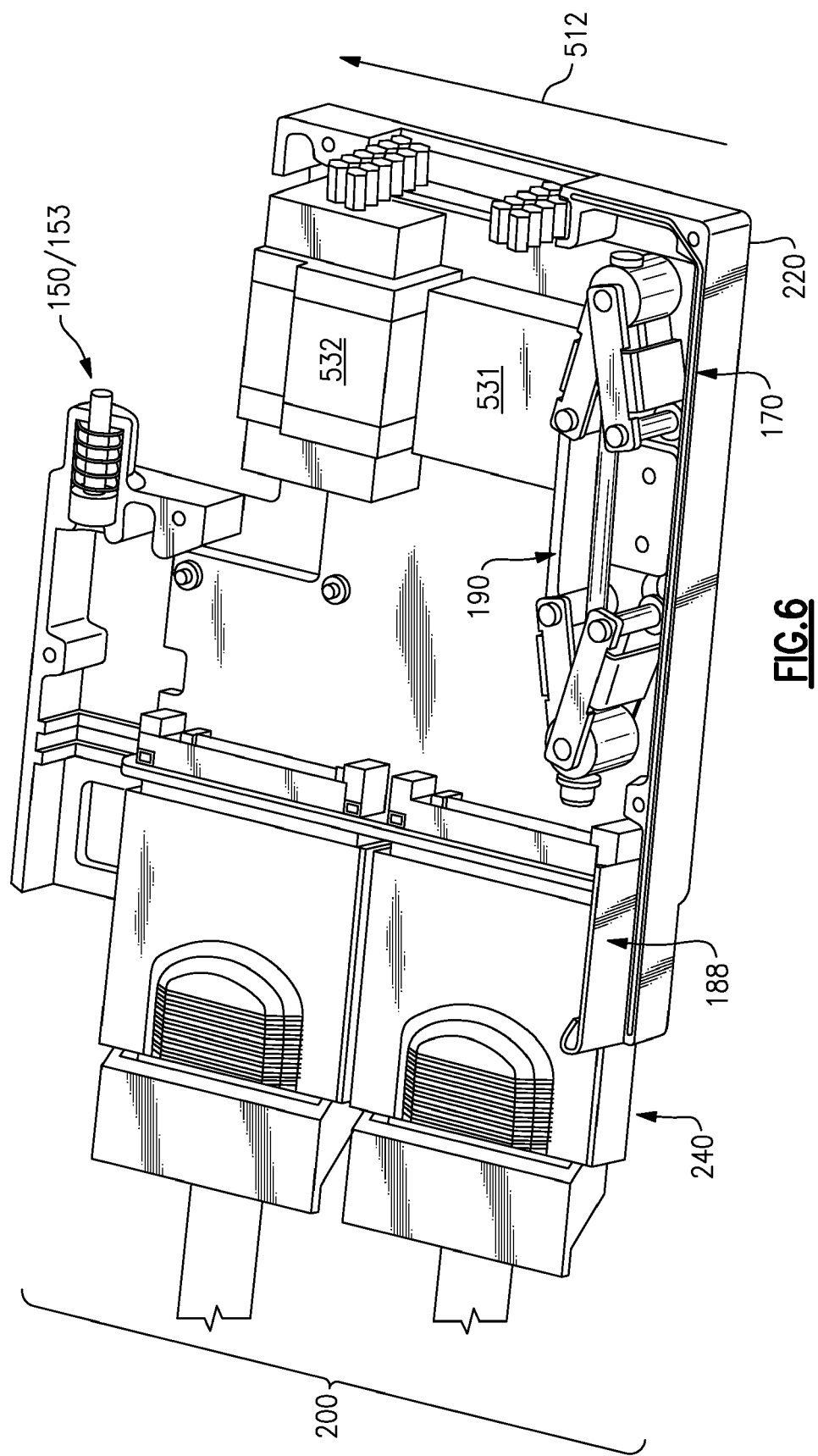
FIG. 6 illustrates a top down view of one embodiment of present invention.

FIGS. 6 and 2a and 2b provide for alternate views of one embodiment of the present invention. It should be understood that while this embodiment will now be discussed in greater detail for ease of understanding, it should not be limiting to subject matter of the present invention as other similar embodiments are possible and can be provided by the teachings of the present invention.

In a preferred embodiment of the present invention, the cassette assembly 200, is to be used in conjunction with a large computing system or computing network that include one or more servers having one or a plurality of central electronic components (CECs).

FIGS. 6 and 2a and 2b, each provide for an input-output (I/O) cassette assembly 200 as provided by the present invention. FIG. 6 provide a top down views of one embodiment of the present invention, while FIGS. 2a and 2b alternatively provide rear and front side views. Different views are provided to aid in discussion of multiple components. Also to aid understanding, an exploded view of the multiple components is provided separately in FIG. 1. FIGS. 6 and FIGS. 2a and 2b will now be discussed together with FIG. 1.

As illustrated in FIG. 1, 2a and 2b, and 6, the I/O card cassette assembly 200 has a housing enclosure 220. The housing or enclosure 220 (hereinafter referred to as housing 220) encloses electronic components, preferably provided on one or more processing card(s) 130, as well as other actuation components as will be discussed.

In one embodiment, the housing 220 of the cassette assembly 200 is comprised of two complementary halves. These two enclosure halves will hereinafter be referenced as upper housing 110 and lower housing 120. The upper and lower housings 110 and 120 are illustrated fully in FIG. 1. In FIGS. 2a and 2b, parts of the lower and upper housings 110 and 120 are viewable in each figure and only as part of the housing 220. In FIG. 6, the upper housing 110 is removed to provide a top-down illustration of the embodiment of the present invention, but the lower housing 110 is still visible in the depiction of FIG. 6.

The upper and lower housing 110 and 120, as stated earlier, are complementary and are designed to securely fit to form a single unitary housing 220, as was discussed previously, that will house the card and actuation assembly. In a preferred embodiment, the housing 220 and/or each of the two halves 110 and 120 have a cast or molded outer shell that is made of metal or metallized components. In a preferred embodiment, the upper and lower housing 110 and 120 are made of cast aluminum or molded metallized polymer, alternatively.

To provide better thermal flow and EMC containment, the housing is designed to provide an overhang, or an awning design 205, best illustrated in FIG. 2b. The awning design is made possible by providing a formed opening area 115 in the upper housing 110, with a complementary integral cable connector shroud area 125 in the lower housing 120.

In one embodiment of the present invention, the overhang 205 of the upper housing 110 features an opening area, preferably a formed inlet screen 115 with apertures 116. The screen design maximizes airflow through and to electronic components enclosed in the cassette assembly 200 while aperture size for single openings 116 to provide for high frequently electro-magnetic (EMC) containment. It should also be noted that while the apertures may not provide direct airflow to some components, but the percent increase over slits or any other such design still provides for a big thermal improvement.

The overhang design 205 (best viewable in FIG. 2b) in the lower housing 120 leads to the incorporation of an integral cable connector shroud 125 which provides circumferential support of the I/O cable assembly 240 and connectors 260. In one embodiment of the present invention as illustrated, the connector shroud 125 also incorporates necessary components, including but not limited to one or more connectors and/or openings to enable cable support and connection. The approach of incorporating an integral cable connector shroud 125, minimizes potential adverse effects to the interconnect interface due to handling damage and/or shock and vibration effects during system transit. In a preferred embodiment, the integral cable connector shroud 125 is molded.

The integral cable shroud 125 in the lower housing 120 is viewed best in FIG. 2a while accommodating and supporting a plurality of cables 260. In one embodiment of the present invention, as illustrated, the integral cable shroud also accommodates I/O cable assemblies 240.

The housing 220 also includes a retention feature 150, which will be also discussed in more detail later. The retention feature 150 can be selectively incorporated entirely into either half 110 and 120 or be selectively placed such that it is partially incorporated into each half 110 and 120 resulting in a single unitary retention feature 150 (each lower and upper retention feature halves being further referenced as 154 and 155 as shown).

Figure 1:
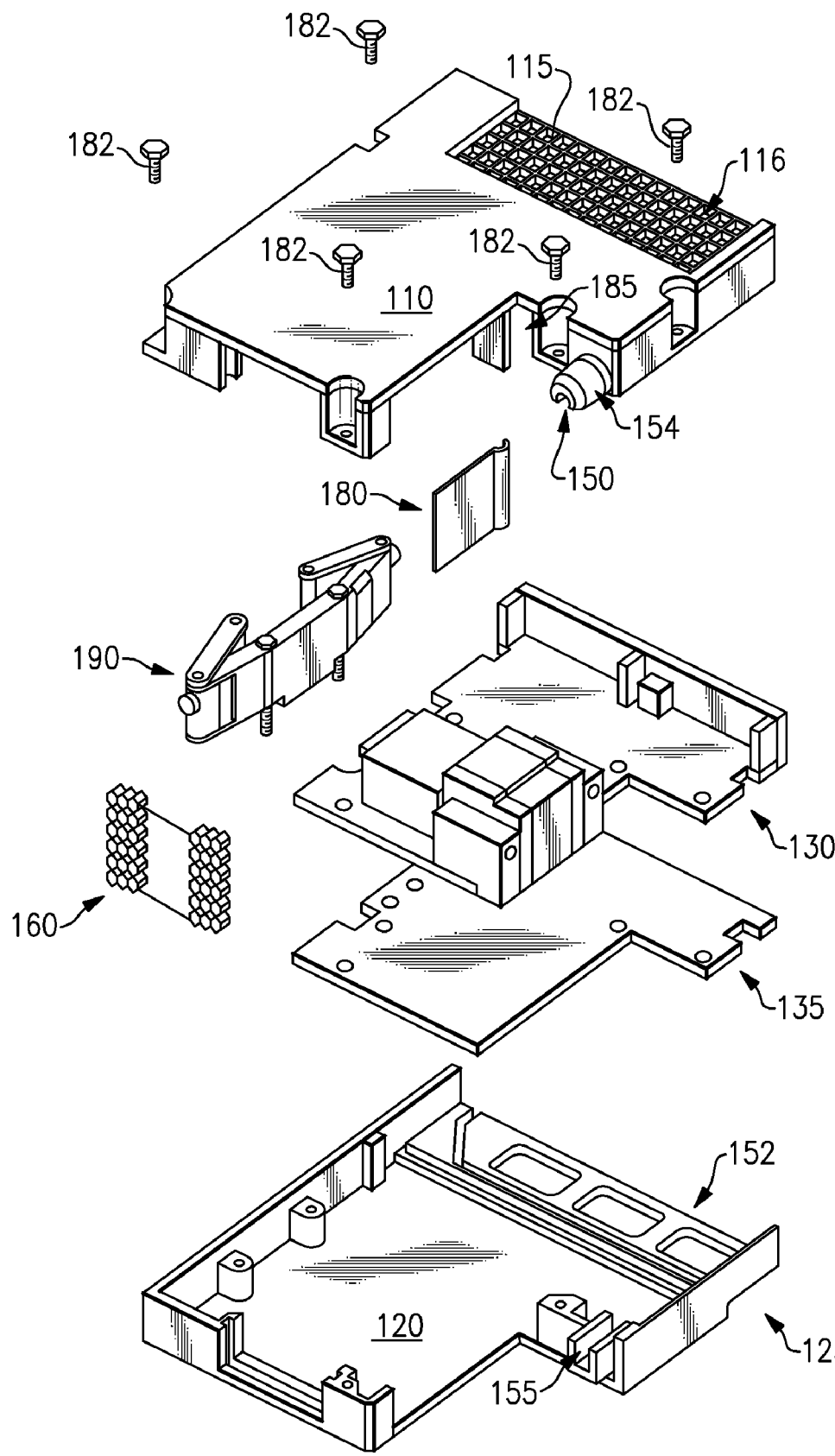
FIG. 1 provides an exploded view of one embodiment of the present invention.

Referring now to FIG. 1 and 6, as previously discussed, the housing 220 encases a electronic components preferably in one or more processing card(s). The processing card(s), can comprise of different units such as illustrated in FIG. 6 (as well as in FIG. 5a and 5b) can also comprise of different components such as connector portion 532 and the integrated circuit (IC) 531, which in the depicted figures is shown as application specific IC or ASIC 531.

In one embodiment of the present invention as shown in the figures, the processing card (including both the connector portion 532 and ASIC 531) is disposed over an insulator 135, preferably an insulator plate. In one embodiment, as shown the processing card(s) is disposed over a local card insulator 135 plate and secured to it using screws, bolts or a variety of other securing means as known to those skilled in the art.

The inlet screen 115, as discussed earlier is designed not to only provide air-flow but also to contain EMC. However, to even better contain EMC effects, in one embodiment of the present invention as illustrated in the figures, the assembly 200 also incorporates at least one honey-comb screen 160. The honey comb screen is preferably located in the rear portion of the cassette assembly 200 as illustrated in FIG. 2b, where a sectioned view is shown.

To even further contain EMC effects, in one embodiment of the present invention, an EMC seam gasket 170 can also be provided, preferably between the upper and lower housing 110 and 120. The location of EMC gasket 170 can be better viewed by referring to FIG. 6. As implied by the name, in this embodiment since the EMC gasket 170 is provided at the seam, the placement of it as shown is at a peripheral edge of the two housing halves 110 and 120.

With the above enumerated features incorporated in the design of the cassette assembly 200 as discussed, all EMC containment issues can be addressed at the cassette level. In conjunction with these, in one embodiment of the present invention, additional external EMC treatments to the next packaging level can be further addressed using traditional edge-gasket approaches known to those skilled in the art.

Referring back to FIG. 1, securing means 182, can be used to secure the lower and upper housing, the insulator, or any of the other components discussed to one another. Securing means can involve a variety of means known to those skilled in the art and can include, but should not be limited to, the screw means shown in the figures.

The enhancements that have been so far can be generally discussed can be categorized as performance based. The performance based features that were introduced were specifically designed to resolve the deficiencies that are either currently present in prior art designs, or that will become challenges in future generation machines and particularly relate to electromagnetic (EMC) and cooling issues.

In conjunction with the performance based features already discussed, the present invention also provides for a number of features that can be incorporated into the cassette assembly 200 to introduce some assembly based resolutions. Assembly based resolutions can be defined as features that are introduced to facilitate or address problems and attributions associated with installation and servicing of the computing systems and or computing devices.

There are two major issues that affect the assembly and packaging of electronic components and computing systems. The first concern is to maintain the assembly integrity with respect to the next higher level of packaging. A second important concern is the problem of actuation and unwanted movements during or prior and after actuation.

The present invention incorporates a series of solutions to overcome the existing concerns with the prior art as enumerated above. To improve the assembly integrity of the cassette to its next higher level of packaging, the cassette housing incorporates a cassette retention feature 150, as was briefly discussed before, to secure the cassette to its next level of packaging, prior to actuating the cassette. This feature, thereby, provides a means to secure the cassette so unwanted movements of assembly do not occur prior to actuation. This aspect is also important because the retention feature 150 is secured without disrupting plugability.

A variety of designs can be incorporated for the retention feature 150. In the earlier discussion with respect to upper and lower housing 110 and 120, the retention feature 150 shown was a positive retention screw, having a boss feature. However, this type of retention feature 150, was only provided as way of example and should not be limiting. In the example depicted in the figures, the boss feature was provided to be secured to a recess hole at the next packaging level. However, the nature of the retention feature 150 can be selectively designed to address the needs of plugability at the next packaging level. For example if in the previous example, the next packaging level had a boss connection, the retention feature 150 could be designed to proved a retention hole design engageable to the boss retention feature at the next packaging level.

In addition, as was previously discussed, the retention feature 150 may be fabricated in one or a plurality of complementary parts, integral to either upper or lower housing or both to also address next packaging level needs. It is even possible, if desired, to incorporate a spring screw assembly to further and better secure the retention feature 150.

Another feature incorporated into the present invention to address actuation needs is a scissor jack component 190 to provide a scissor jack mechanism. In one embodiment of the present invention, the scissor jack component 190, can be designed such that it can be easily incorporated into the assembly 200. For example the scissor jack can be a tool-assisted, screw actuated mechanism, but the use and design of this component (190) shall not be limited to this as other similar embodiments are also possible.

The scissor jack component 190, in one embodiment of the present invention as shown in the figures, is disposed over the insulator 135 and adjacent to the processing card 130. The placement needs not to be too exact as long as it is close to the electronic components. For example in FIG. 3b, the scissor jack mechanism is placed on an opposing side to the card assembly on the insulator plate 135, while FIGS. 5 and 6 show a more detailed configuration where the scissor jack mechanism 190 is placed adjacent to ASIC 531.

Figure 3A:
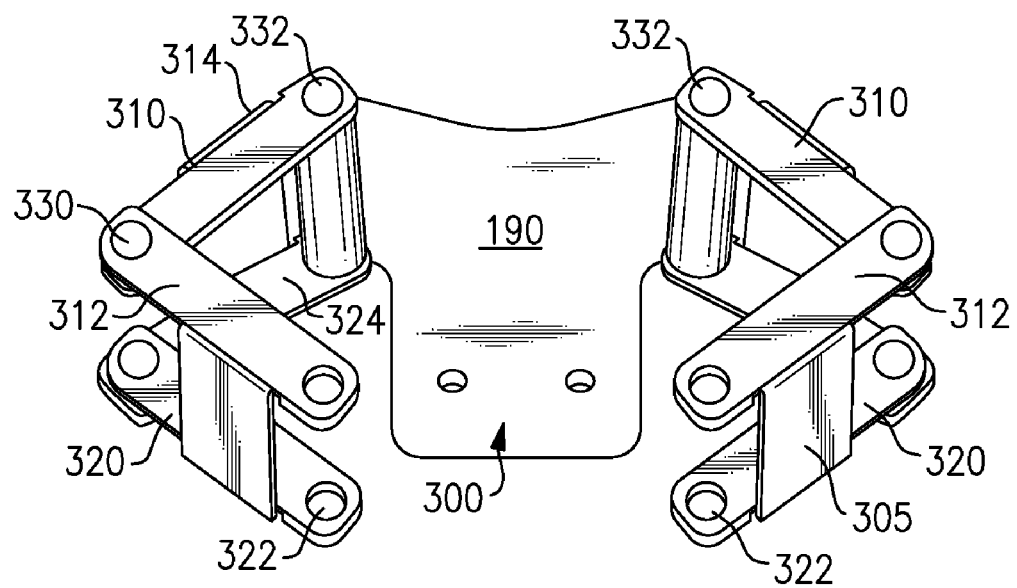
FIGS. 3a and 3b illustrate a scissor jack component as per the embodiment of FIG. 1.
Figure 3B:
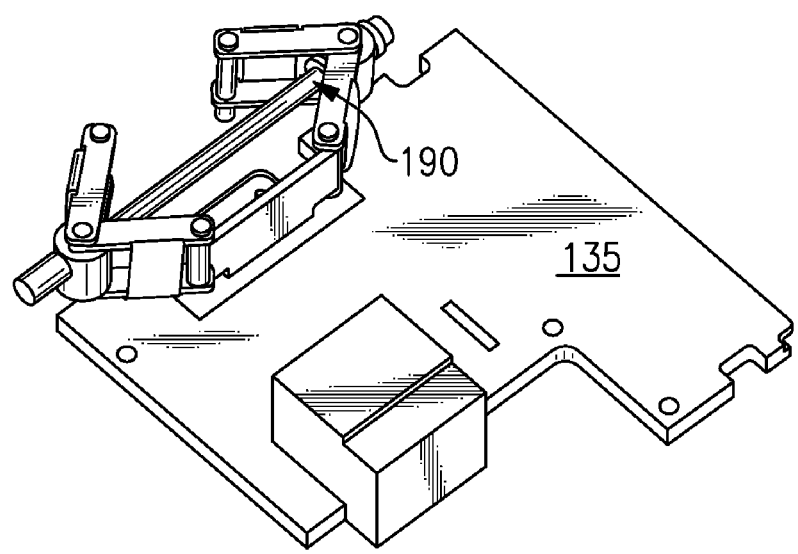

In FIG. 3a, the scissor jack mechanism is illustrated by way of example. The shape of the scissor jack mechanism should not be limited to the one shown in the example of FIG. 3a, however. A variety of different embodiments with a variety of scissor jack component designs can be implemented. However, any such design should be such that it should incorporate the scissor jack component 190 collinearly with the assembly to provide best support against the perpendicular force that is being exerted on the assembly, in order to provide additional stability.

The embodiment provided in FIG. 3a, shows the scissor jack mechanism as having a main body 300 and a plurality of arms 310 and 320, connected to one another through connector arm 305. In the embodiment provided, the arms 310 and 320 come in a plurality of levels, with arms referenced as 310 being the upper portion arms and those referenced as 320 being the lower portion arms. This is because as per a preferred embodiment of the present invention, the scissor jack component 190, engages both to the upper and lower housing 110 and 120 Although such engagement, and especially to both housings, may not be necessary for some embodiments of the present invention, but when a smooth and tactile solution is preferred, such dual sided support during mating provides true parallelism of the card-board mated interfaces.

In the embodiment illustrated in FIG. 3a, the upper and lower arms 310 and 320 are respectively secured to upper and lower housing 110 and 120. Screws 332 or other securing means can be used to accomplish this task. The scissor jack component 190 must have design features to enable it to go from a first to a second position as to enable the actuation and unmating of the cassette assembly as shown and will be later discussed in more detail in conjunction with FIG. 5a and 5b. In the embodiment of FIG. 3a, this ability is secured by providing a jointed design (joint referenced at 330). In this embodiment, the upper and lower arms 310 and 320 are each further comprised of a plurality of portions 312, 314 and 322, 324 as illustrated. In a preferred embodiment, the scissor jack is a tool assisted, and the change of position is further enhanced by incorporating a screw-actuated mechanism.

Figure 4:
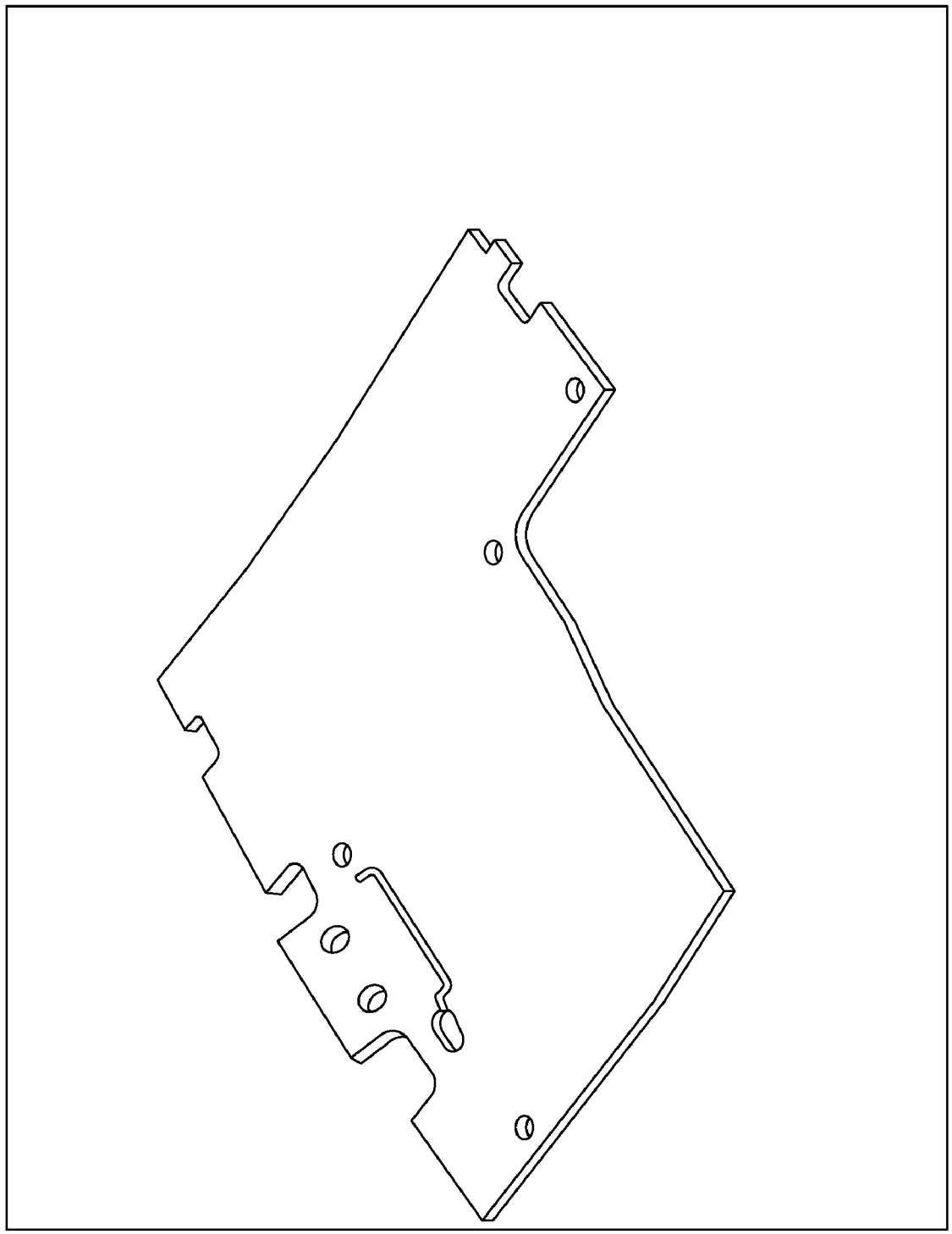
FIG. 4 is a graphical illustration showing the effects of strain and deflection causing potential structural failures.

Other designs such as substitution of, for example, an actuation bracket or the like does not lead as good of a result as that of the scissor jack component 190. For example, experimental results show that when a bracket is used, even an actuation force of 50 pounds applied to such a bracket will result in the top of the bracket to slide along its plane, resulting in one case in a deflection of 0.05. In some cases, such deflection can cause a gap between the retention feature 150 and the next level of packaging where the retention feature is to be secured. FIGS. 4 illustrate such structural deflection.

Figure 5B:
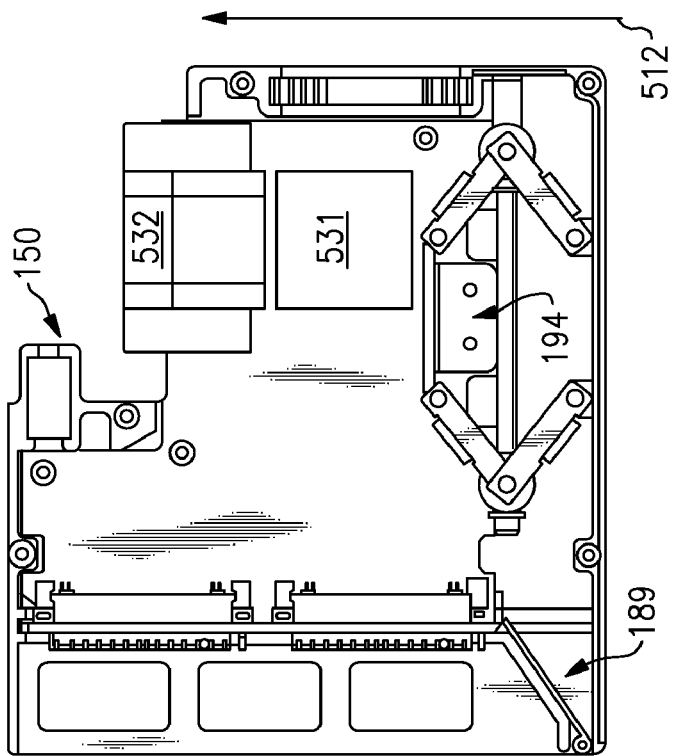
FIGS. 5a and 5b provide exposed views of the actuated and unactuated card using the scissor jack component as per embodiment of the invention.
Figure 5A:
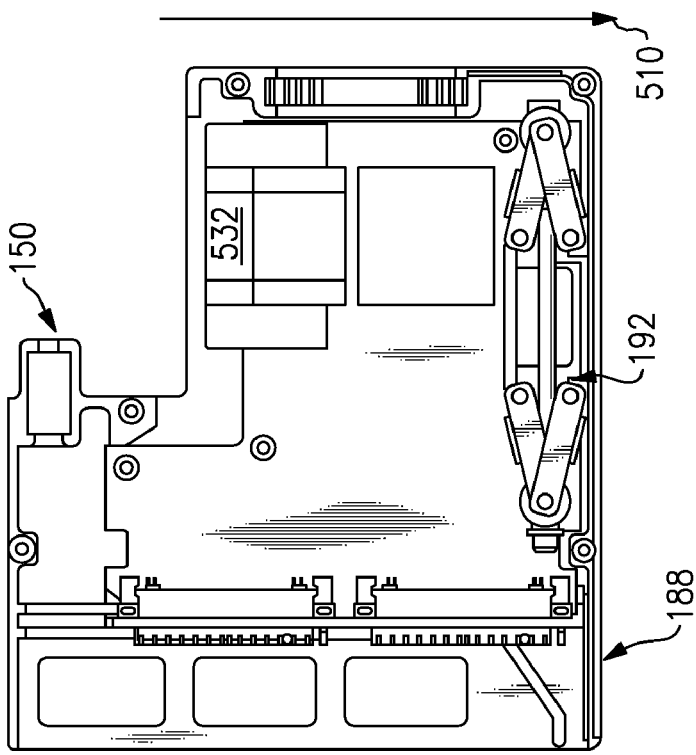

FIGS. 5a and 5b, are illustration of the unmating and actuation of the cassette assembly 200, respectively. The unmating direction and the actuation direction are respectively illustrated by arrow directions referenced as 510 and 512. The illustration of FIGS. 5a and 5b also display how the scissor jack component 190 can move from one position (referenced as 192) to another position (referenced as 194) to enable the unmating and actuation of the cassette assembly 200, such as to a next level of packaging.

FIGS. 5a and 5b also better illustrate the deployment of an actuation trap door 180, that is preferably spring loaded. The actuation trap door 180 was referenced as actuation screw trap door 180 in FIG. 1 as per that embodiment. It should be noted that FIG. 6 also illustrate both the scissor jack component 190 and the trap door feature 180 in is undeployed condition. In one embodiment of the present invention, the actuation trap door 180 is in mechanical processing with said scissor jack component to enable the unmating and actuation of the cassette assembly as illustrated.

To further provide a more rigid and structurally secure solution, in one embodiment of the present invention as illustrated in the figures, the cassette assembly 200 can also incorporate a vertical support strut 185, referenced in the figures as card support member 185. This support strut 185 is best visible in FIG. 2b. In one embodiment of the present invention, the vertical support strut 185 is integral to the upper housing 210 but other embodiments are possible. In addition, in a preferred embodiment, the vertical support strut 185 is also integral to the global card insulator such as the local card insulator 135 shown in FIG. 1. The design of the support strut 185 as being integral to both the upper housing 210 and the global card insulator 135, prevents adverse strains from being imparted to the connectors SMT solder joints. This design also ensures an improvement and ease of motion of sliding surfaces, such as card to lower housing 220, during connector actuation.

As discussed in the above paragraphs, the present invention, in each case, whether addressing assembly or performance based issues and concerns provides for an improved and novel way of introducing addresses, mechanical features and particular approach for assembling them are implemented specifically and in each case with special attention to address the problems of cooling, EMC concerns and mechanical and structural concerns. Therefore, the designs provided in FIGS. 1-6 and the related embodiments each are specifically designed to maximize air-flow capability, contain EMC emission at the source and improve processing card(s) and card-board interconnect mechanical support. In addition, the embodiments of FIGS. 1-6 are provided specifically such that the approach addresses cooling, EMC and mechanical plugging deficiencies and concerns using available and traditional blind-mated approaches which make the teachings of the present invention both cost effective and easy to implement.

It should be noted also that the design of FIGS. 1 and 2 as can be seen and will be further discussed, is such that the actuation hardware can be moved between the processing card(s) 130 and the upper housing portion 110 of the housing assembly 200 rather than being placed between the card's underside and the lower side of the housing, as has been traditionally the case. This design provides the opportunity for increasing the components and/or heat sink heights and thereby improving the package's cooling attributes.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A cassette assembly for protecting electronic components, comprising
    a housing for enclosing electronic components provided in at least one processing card disposed over an insulator; and
    a dual inverted scissor jack mechanism disposed on said insulator collinearly to said assembly inside said housing and enabled to move from a first position to a second position to cause actuation and unmating of said cassette assembly such as to selectively provide coplanar movement with respect to said housing.

2. The assembly of claim 1, wherein said a plurality of electronic components are provided in said housing and said insulator is an insulator plate and said scissor jack and said processing card(s) are disposed in close proximity to one another.

3. The assembly of claim 2, wherein said housing comprises an overhang including an upper opening area and a lower cable connector shroud having openings to enable cable support and connection.

4. The assembly of claim 3, wherein said housing is comprised of an upper and a lower housing portion that are complementary to one another, such when disposed over one another they provide a secure fit and form a single unitary housing entity.

5. The assembly of claim 4, wherein said opening area is an inlet screen with apertures selectively designed such that said screen provides heat dissipation relief and provides for electromagnetic containment.

6. The assembly of claim 5, wherein said scissor jack mechanism inside said housing is situated to side of said housing with said overhang and engages both said upper and lower housing.

7. The assembly of claim 6, wherein said scissor jack mechanism further comprises: a plurality of upper and lower arms connected to one another through a connector arm, said arms each being jointed and securable to said upper and lower housings.

8. The assembly of claim 7, wherein said scissor jack is a tool assisted, screw-actuated and driven mechanism.

9. The assembly of claim 4, further comprising an electromagnetic gasket seal, disposed between said two housing halves.

10. The assembly of claim 1, further comprising an actuation trap door disposed inside said housing in said overhang area and in mechanical processing with said scissor jack mechanism for enabling unmating and actuation of said cassette assembly.

11. The assembly of claim 10, wherein said processing card(s) is secured to said insulator plate.

12. The assembly of claim 11, wherein said assembly further comprises a honeycomb screen secured to said housing on an opposing side to said overhang is located.

13. The assembly of claim 12, further comprising a support member integral to said upper housing for adding structural rigidity and strength to said housing.

14. The assembly of claim 1, wherein said housing has a cast or molded outer shell.

15. The assembly of claim 14, wherein said housing is fabricated of metal or metal compounds.

16. The assembly of claim 15, wherein said upper and lower housing is fabricated of cast aluminum.

17. The assembly of claim 15, wherein said upper and lower housing is fabricated of metallized polymer.

18. The assembly of claim 15, wherein said housing halves are fabricated such that actuation hardware can be moved between said processing card and said upper housing portion.

19. A cassette assembly for protecting electronic components, comprising:
    a housing for enclosing electronic components disposed over an insulator;
    said housing having an overhang with an upper inlet screen area and a complementary a lower cable shroud with openings to support cable connections;
    said housing also enclosing a dual inverted scissor jack mechanism disposed over said insulator, collinear to said cassette assembly, in close proximity to said electronic components; said scissor jack component capable of moving from a first to a second position to cause actuation and unmating of said cassette assembly.

20. An improved method of packaging electronic components, comprising the steps of:
    enclosing electronic components disposed over an insulator inside a housing cassette assembly having an overhang for housing electronic components;
    providing complementary inlet screens and cable shroud connector area on an upper and lower portion of said housing respectively; and
    disposing a dual inverted scissor jack mechanism over said insulator inside said housing and in close proximity to said electronic components, said scissor jack component enabling unmating and actuation of said cassette assembly by moving from a first position to a second position.

* * * * *